United States Patent
Prasad et al.

(10) Patent No.: US 12,266,551 B2
(45) Date of Patent: *Apr. 1, 2025

(54) APPARATUS, SYSTEM, AND METHOD FOR NON-CONTACT TEMPERATURE MONITORING OF SUBSTRATE SUPPORTS

(71) Applicant: Applied Materials, Inc., Santa Clara, CA (US)

(72) Inventors: Bhaskar Prasad, Jamshedpur (IN); Kirankumar Neelasandra Savandaiah, Bangalore (IN); Thomas Brezoczky, Los Gatos, CA (US); Srinivasa Rao Yedla, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/317,347

(22) Filed: May 15, 2023

(65) Prior Publication Data
US 2023/0282500 A1    Sep. 7, 2023

Related U.S. Application Data

(63) Continuation of application No. 16/939,629, filed on Jul. 27, 2020, now Pat. No. 11,749,542.

(51) Int. Cl.
*H01L 21/67* (2006.01)
*H01L 21/66* (2006.01)
H01L 21/683 (2006.01)

(52) U.S. Cl.
CPC ........ *H01L 21/67248* (2013.01); *H01L 22/12* (2013.01); *H01L 21/6833* (2013.01)

(58) Field of Classification Search
CPC ............... H01L 21/67248; H01L 22/12; H01L 21/6833; H01L 21/67346; H01L 21/6831; H01L 21/68785

See application file for complete search history.

(56) References Cited

U.S. PATENT DOCUMENTS

| | | |
|---|---|---|
| 4,979,134 A | 12/1990 | Arima et al. |
| 5,769,540 A | 6/1998 | Schietinger et al. |

(Continued)

FOREIGN PATENT DOCUMENTS

| | | | | |
|---|---|---|---|---|
| CN | 101040059 B | * | 6/2011 | ............ C03C 15/00 |
| CN | 111373520 A | * | 7/2020 | ....... H01L 21/67103 |

(Continued)

OTHER PUBLICATIONS

Notice of Reasons for Rejection in related application JP 2023-505364 dated Mar. 19, 2024.

(Continued)

*Primary Examiner* — Mohammed Shamsuzzaman
(74) *Attorney, Agent, or Firm* — Patterson + Sheridan, LLP (57) ABSTRACT

Embodiments of the present disclosure relate to apparatus, systems and methods for substrate processing. A detachable substrate support is disposed within a processing volume of a processing chamber and the substrate support includes a substrate interfacing surface and a back surface. The pedestal hub has a supporting surface removably coupled to the substrate support. A hub volume of the pedestal hub includes temperature measuring assembly disposed therein positioned to receive electromagnetic energy emitted from the back surface of the substrate support. The temperature measuring assembly measures an intensity of the electromagnetic energy entering the assembly and generates intensity signals. An apparent temperature of the substrate is determined based on the intensity signals.

20 Claims, 5 Drawing Sheets

(56) References Cited

U.S. PATENT DOCUMENTS

| | | |
|---|---|---|
| 5,863,170 A | 1/1999 | Boitnott et al. |
| 5,879,459 A | 3/1999 | Gadgil et al. |
| 6,162,299 A | 12/2000 | Raaijmakers |
| 6,440,261 B1 | 8/2002 | Tepman et al. |
| 6,447,607 B2 | 9/2002 | Soininen et al. |
| 6,576,062 B2 | 6/2003 | Matsuse |
| 6,604,853 B2 | 8/2003 | Chao et al. |
| 6,635,115 B1 | 10/2003 | Fairbairn et al. |
| 6,852,194 B2 | 2/2005 | Matsushita et al. |
| 6,962,471 B2 | 11/2005 | Birkner et al. |
| 7,066,703 B2 | 6/2006 | Johnson |
| 7,090,741 B2 | 8/2006 | Narushima et al. |
| D527,751 S | 9/2006 | Kondoh et al. |
| 7,138,336 B2 | 11/2006 | Lee et al. |
| 7,169,234 B2 | 1/2007 | Weeks et al. |
| 7,189,432 B2 | 3/2007 | Chiang et al. |
| 7,258,768 B2 | 8/2007 | Yamazaki |
| 7,318,869 B2 | 1/2008 | Chiang et al. |
| 7,422,406 B2 | 9/2008 | van der Meulen |
| 7,458,763 B2 | 12/2008 | van der Meulen |
| 7,537,662 B2 | 5/2009 | Soininen et al. |
| 7,784,164 B2 | 8/2010 | White et al. |
| 7,799,179 B2 | 9/2010 | Maass et al. |
| 7,806,983 B2 | 10/2010 | Chiang et al. |
| 7,833,352 B2 | 11/2010 | Bondestam et al. |
| 7,905,991 B2 | 3/2011 | Esselbach et al. |
| 7,959,403 B2 | 6/2011 | van der Meulen |
| 7,988,399 B2 | 8/2011 | van der Meulen |
| 8,029,226 B2 | 10/2011 | van der Meulen |
| 8,033,772 B2 | 10/2011 | Kurita et al. |
| 8,088,678 B2 | 1/2012 | Kitano et al. |
| 8,197,177 B2 | 6/2012 | van der Meulen et al. |
| 8,216,380 B2 | 7/2012 | White et al. |
| 8,267,632 B2 | 9/2012 | van der Meulen et al. |
| 8,292,563 B2 | 10/2012 | Haris |
| 8,313,277 B2 | 11/2012 | van der Meulen et al. |
| 8,354,656 B2 | 1/2013 | Beloussov et al. |
| 8,403,613 B2 | 3/2013 | van der Meulen |
| 8,434,989 B2 | 5/2013 | van der Meulen |
| 8,439,623 B2 | 5/2013 | van der Meulen |
| 8,500,388 B2 | 8/2013 | van der Meulen et al. |
| 8,523,507 B2 | 9/2013 | van der Meulen |
| 8,558,299 B2 | 10/2013 | Cao et al. |
| 8,574,409 B2 | 11/2013 | Kadlec et al. |
| 8,602,716 B2 | 12/2013 | van der Meulen et al. |
| 8,672,605 B2 | 3/2014 | van der Meulen et al. |
| 8,696,298 B2 | 4/2014 | van der Meulen et al. |
| 8,728,239 B2 | 5/2014 | Bauer et al. |
| 8,807,905 B2 | 8/2014 | Meulen |
| 8,812,150 B2 | 8/2014 | van der Meulen et al. |
| 8,870,513 B2 | 10/2014 | Voser et al. |
| 8,870,514 B2 | 10/2014 | van der Meulen et al. |
| 8,895,450 B2 | 11/2014 | Cao et al. |
| 8,944,738 B2 | 2/2015 | van der Meulen |
| 8,945,308 B2 | 2/2015 | Schaller |
| 9,005,539 B2 | 4/2015 | Halpin et al. |
| 9,085,825 B2 | 7/2015 | Kim |
| 9,103,030 B2 | 8/2015 | Kato et al. |
| 9,214,589 B2 | 12/2015 | Voser et al. |
| 9,252,037 B2 | 2/2016 | Scholte Von Mast et al. |
| 9,281,222 B2 | 3/2016 | Weaver et al. |
| 9,336,997 B2 | 5/2016 | Bera |
| 9,340,874 B2 | 5/2016 | Halpin et al. |
| 9,347,131 B2 | 5/2016 | Maass et al. |
| 9,355,824 B2 | 5/2016 | Kadlec et al. |
| 9,378,994 B2 | 6/2016 | Weaver et al. |
| 9,396,981 B2 | 7/2016 | Scholte Von Mast et al. |
| 9,443,749 B2 | 9/2016 | Wakabayashi et al. |
| 9,478,420 B2 | 10/2016 | Castaldi et al. |
| 9,490,149 B2 | 11/2016 | Chandrasekharan et al. |
| 9,551,068 B2 | 1/2017 | Kumagai et al. |
| 9,583,349 B2 | 2/2017 | Gandikota et al. |
| 9,587,306 B2 | 3/2017 | Rohrmann et al. |
| 9,644,261 B2 | 5/2017 | Weichart et al. |
| 9,698,009 B2 | 7/2017 | Sato et al. |
| 9,831,094 B2 | 11/2017 | Rahtu et al. |
| 9,842,755 B2 | 12/2017 | Ocker et al. |
| 9,884,726 B2 | 2/2018 | van der Meulen et al. |
| 9,890,473 B2 | 2/2018 | Newman |
| 9,917,242 B2 * | 3/2018 | Barnett ............... G01J 5/0225 |
| 9,929,008 B2 | 3/2018 | Wamura et al. |
| 9,932,674 B2 | 4/2018 | Kato et al. |
| 9,953,843 B2 | 4/2018 | Shen et al. |
| 9,960,072 B2 | 5/2018 | Coomer |
| 10,043,693 B1 | 8/2018 | Kim et al. |
| 10,086,511 B2 | 10/2018 | van der Meulen |
| 10,138,553 B2 | 11/2018 | Scholte Von Mast et al. |
| 10,145,014 B2 | 12/2018 | Nozawa et al. |
| 10,202,682 B2 | 2/2019 | Rieschl et al. |
| 10,202,687 B2 | 2/2019 | Miura et al. |
| 10,221,480 B2 | 3/2019 | Kato et al. |
| 10,256,125 B2 | 4/2019 | Weaver et al. |
| 10,262,888 B2 | 4/2019 | Gangakhedkar et al. |
| 10,347,515 B2 | 7/2019 | Heinz |
| 10,388,559 B2 | 8/2019 | Rieschl et al. |
| 10,427,303 B2 | 10/2019 | Weaver et al. |
| 10,586,720 B2 | 3/2020 | Weaver et al. |
| 10,861,682 B2 * | 12/2020 | O'Banion ......... H01L 21/67109 |
| 2002/0051698 A1 | 5/2002 | Birkner et al. |
| 2002/0170671 A1 | 11/2002 | Matsushita et al. |
| 2003/0109094 A1 | 6/2003 | Seidel et al. |
| 2004/0159553 A1 | 8/2004 | Nogami et al. |
| 2004/0261710 A1 | 12/2004 | Matsushita et al. |
| 2005/0005850 A1 | 1/2005 | Yamazaki |
| 2005/0006230 A1 | 1/2005 | Narushima et al. |
| 2005/0111936 A1 | 5/2005 | Kim et al. |
| 2005/0115822 A1 | 6/2005 | Maass et al. |
| 2005/0118009 A1 | 6/2005 | van der Meulen |
| 2006/0051507 A1 | 3/2006 | Kurita et al. |
| 2006/0056488 A1 * | 3/2006 | Surname ................ G01K 7/36 |
| | | 374/E7.039 |
| 2006/0056952 A1 | 3/2006 | Haris |
| 2006/0101728 A1 | 5/2006 | White et al. |
| 2006/0137608 A1 | 6/2006 | Choi et al. |
| 2006/0137609 A1 | 6/2006 | Puchacz et al. |
| 2006/0140248 A1 * | 6/2006 | Gotthold ............... G01K 11/20 |
| | | 374/161 |
| 2006/0157340 A1 | 7/2006 | Kurita et al. |
| 2006/0201074 A1 | 9/2006 | Kurita et al. |
| 2006/0263177 A1 | 11/2006 | Meulen |
| 2007/0020890 A1 | 1/2007 | Thakur et al. |
| 2007/0215036 A1 | 9/2007 | Park et al. |
| 2007/0281090 A1 | 12/2007 | Kurita et al. |
| 2008/0014055 A1 | 1/2008 | van der Meulen |
| 2008/0072821 A1 | 3/2008 | Dalton et al. |
| 2008/0124194 A1 | 5/2008 | van der Meulen et al. |
| 2008/0124197 A1 | 5/2008 | van der Meulen et al. |
| 2008/0138176 A1 | 6/2008 | Kim et al. |
| 2008/0187417 A1 | 8/2008 | van der Meulen et al. |
| 2008/0219808 A1 | 9/2008 | van der Meulen et al. |
| 2008/0219812 A1 | 9/2008 | van der Meulen et al. |
| 2008/0226429 A1 | 9/2008 | van der Meulen |
| 2008/0232947 A1 | 9/2008 | van der Meulen et al. |
| 2008/0268753 A1 * | 10/2008 | Ishikawa ................ B24B 37/30 |
| | | 451/36 |
| 2009/0087286 A1 | 4/2009 | Meulen |
| 2009/0173622 A1 | 7/2009 | Weichart et al. |
| 2009/0180847 A1 * | 7/2009 | Guo .................... H01L 21/6719 |
| | | 414/217 |
| 2009/0276097 A1 * | 11/2009 | Patalay ................... H01L 21/68 |
| | | 118/712 |
| 2010/0012036 A1 | 1/2010 | Silva et al. |
| 2010/0075453 A1 | 3/2010 | Kurita et al. |
| 2010/0120238 A1 | 5/2010 | Kitano et al. |
| 2010/0281683 A1 | 11/2010 | White et al. |
| 2010/0304027 A1 | 12/2010 | Lee et al. |
| 2010/0327187 A1 | 12/2010 | Beloussov et al. |
| 2012/0027542 A1 | 2/2012 | Isomura et al. |
| 2012/0031749 A1 | 2/2012 | Dubs et al. |
| 2012/0304928 A1 * | 12/2012 | Koelmel ............ H01L 21/67115 |
| | | 118/712 |
| 2012/0328797 A1 | 12/2012 | Maass et al. |
| 2013/0224639 A1 * | 8/2013 | Miyamoto ............ G03F 7/2041 |
| | | 430/30 |

(56) References Cited

U.S. PATENT DOCUMENTS

| | | |
|---|---|---|
| 2013/0302115 A1 | 11/2013 | Wakabayashi et al. |
| 2014/0262035 A1 | 9/2014 | Merry et al. |
| 2014/0349011 A1 | 11/2014 | Weichart |
| 2015/0063957 A1 | 3/2015 | Olgado |
| 2015/0232983 A1* | 8/2015 | West .................. H01J 37/3244 165/104.34 |
| 2015/0240360 A1* | 8/2015 | Leeser ................ H01L 21/6719 118/723 R |
| 2016/0108515 A1 | 4/2016 | Elghazzali et al. |
| 2016/0138159 A1 | 5/2016 | Kato et al. |
| 2016/0149482 A1* | 5/2016 | Criminale ................ H02J 3/14 307/38 |
| 2016/0345384 A1* | 11/2016 | Zhang ............ H01L 21/67248 |
| 2017/0062260 A1* | 3/2017 | Cox .................... H01L 21/6833 |
| 2017/0062261 A1* | 3/2017 | Cox .................... H01L 21/6833 |
| 2017/0081764 A1 | 3/2017 | Aburatani et al. |
| 2017/0175247 A1 | 6/2017 | Weichart |
| 2017/0218514 A1 | 8/2017 | Kato et al. |
| 2017/0236733 A1* | 8/2017 | Leeser ................ C23C 16/4557 118/712 |
| 2018/0142350 A1 | 5/2018 | Fukiage et al. |
| 2018/0195173 A1 | 7/2018 | Kato et al. |
| 2018/0245212 A1 | 8/2018 | Schwyn-Thony et al. |
| 2018/0245218 A1 | 8/2018 | Kato |
| 2018/0261473 A1 | 9/2018 | Weichart et al. |
| 2018/0294176 A1* | 10/2018 | Nakagawasai .... H01L 21/68792 |
| 2018/0334745 A1 | 11/2018 | Kato |
| 2019/0013225 A1 | 1/2019 | Taguchi et al. |
| 2019/0032210 A1* | 1/2019 | Mustafa .................. G01K 1/146 |
| 2019/0043744 A1* | 2/2019 | Cho .................. H01L 21/68735 |
| 2019/0049484 A1* | 2/2019 | Yanagisawa ........ G01P 15/0802 |
| 2019/0096715 A1 | 3/2019 | Lodder et al. |
| 2019/0157131 A1* | 5/2019 | Nosrati ............. C23C 16/45536 |
| 2019/0252160 A1 | 8/2019 | Balon et al. |
| 2019/0252166 A1 | 8/2019 | Felzer et al. |
| 2019/0391017 A1* | 12/2019 | Ranish ................ G01K 11/125 |
| 2020/0294836 A1* | 9/2020 | Criminale ......... H01L 21/67103 |
| 2021/0022212 A1* | 1/2021 | Cimino ............ H01L 21/67063 |
| 2021/0057244 A1* | 2/2021 | Ramachandran ....... G01J 5/048 |
| 2022/0076971 A1* | 3/2022 | Savandaiah ....... H01L 21/67196 |
| 2022/0076978 A1* | 3/2022 | Prasad ............. H01L 21/68785 |

FOREIGN PATENT DOCUMENTS

| | | | | |
|---|---|---|---|---|
| CN | 112420472 A | * | 2/2021 | ............ H01J 37/321 |
| CN | 107546150 B | * | 8/2021 | ............. C23C 16/46 |
| JP | 2001057342 A | | 2/2001 | |
| JP | 4034344 B2 | * | 1/2008 | ....... H01L 21/67109 |
| JP | 2013102246 A | * | 5/2013 | ............. H01L 31/18 |
| JP | 2014110378 A | | 6/2014 | |
| JP | 2015049073 A | * | 3/2015 | |
| JP | 2017069531 A | * | 4/2017 | ............. B08B 11/02 |
| JP | 6330623 B2 | * | 5/2018 | ......... C23C 16/4409 |
| JP | 7119042 B2 | * | 8/2022 | ............ C23C 14/042 |
| KR | 20080047415 A | | 5/2008 | |
| KR | 20120105245 A | * | 9/2012 | ............. H01L 31/18 |
| TW | 201432781 A | * | 8/2014 | ............ C23C 16/402 |
| TW | 202013555 A | * | 4/2020 | ............. B23K 26/03 |
| TW | 202025373 A | * | 7/2020 | ......... C23C 16/4582 |
| TW | 202114015 A | * | 4/2021 | ............. B65G 29/00 |
| TW | 202135121 A | * | 9/2021 | ............. C23C 14/48 |
| WO | WO-2005124840 A1 | * | 12/2005 | ........ H01L 21/67115 |
| WO | 200734707 A1 | | 3/2007 | |
| WO | 201487920 A1 | | 6/2014 | |
| WO | WO-2014143204 A1 | * | 9/2014 | ............. G01N 21/35 |
| WO | WO-2016190905 A1 | * | 12/2016 | ....... H01L 21/67103 |
| WO | 2018131362 A1 | | 7/2018 | |
| WO | WO-2019105944 A1 | * | 6/2019 | ....... H01L 21/67103 |
| WO | WO-2021183332 A1 | * | 9/2021 | ............ G01J 5/0007 |
| WO | WO-2023069463 A1 | * | 4/2023 | |

OTHER PUBLICATIONS

Korean Office Action issued to patent application No. 10-2023-7006521 on Jul. 1, 2024.

Taiwan Office Action issued to patent application No. 110114033 on Oct. 23, 2024.

* cited by examiner

APPARATUS, SYSTEM, AND METHOD FOR NON-CONTACT TEMPERATURE MONITORING OF SUBSTRATE SUPPORTS

CROSS-REFERENCE TO RELATED APPLICATION

This application is a continuation of co-pending U.S. patent application Ser. No. 16/939,629, filed, Jul. 27, 2020. The aforementioned related patent application is herein incorporated by reference in its entirety.

BACKGROUND

Field

Embodiments of the present disclosure generally relate to apparatuses, systems and methods for processing semiconductor substrates. More particularly, embodiments of the disclosure relate to non-contact temperature monitoring systems for substrate supports.

Description of the Related Art

In thermal processes typically used to process semiconductor substrates, such as chemical vapor deposition (CVD), physical vapor deposition (PVD), and atomic layer deposition (ALD), substrates are processed under controlled processing conditions. During processing, the temperature of the substrates are often monitored and managed to control the process within a temperature range. One way to measure the substrate temperature, is to measure the temperature of a substrate support that holds the substrate within a processing volume. The temperature of the back surface of substrate supports are typically measured using direct contact devices such as thermocouples. Such devices typically create a thermal drain that can affect temperature uniformity and energy delivery efficiency due to the loss of energy taken for the measurement. Non-contact sensors have traditionally not been a viable option due to cost and the challenges of measuring wide temperature ranges that can be used in different thermal processes. In particular, certain pyrometers have been contemplated, however, pyrometers are typically not able to detect low temperature ranges. Accordingly, there is a need for a non-contact temperature monitoring system for measuring a wide range of temperatures of a substrate and a substrate support.

Therefore, there is a need for a non-contact temperature monitoring systems that solves the problems described above.

SUMMARY

In an embodiment, a substrate processing apparatus is provided including a thermal processing chamber defining a processing volume. A substrate support within the processing volume, the substrate support having a substrate interfacing surface and a back surface. A pedestal hub is removably coupled to substrate support by a contact pin assembly. A viewport is coupled to the pedestal hub. The substrate support is a transferable substrate support that can be positioned over a sensor. The sensor is disposed within the pedestal hub and has an input end positioned to receive electromagnetic energy emitted from the back surface of the substrate support through the viewport of the pedestal hub. The substrate support is decoupled from and is positionable in a first direction relative to the sensor and the pedestal hub. The sensor is configured to measure an intensity of the electromagnetic energy entering the sensor and to generate intensity signals. The sensor is communicatively coupled to a processor configured to determine an apparent temperature based on the intensity signals.

In another embodiment, a substrate processing apparatus is provided, including a processing chamber defining a processing volume. A substrate support is disposed within the processing volume and the substrate support includes a substrate interfacing surface and a back surface. The processing chamber includes a pedestal hub defining at least a portion of a hub volume. The pedestal hub has a supporting surface removably coupled to the substrate support. The pedestal hub volume includes a probe disposed therein, the probe has an input end positioned to receive electromagnetic energy emitted from the back surface of the substrate support. The substrate support is positionable in a first direction relative to the probe and the pedestal hub and is coupled to the pedestal hub once aligned thereto. A sensor is optically coupled to an output end of the probe and is configured to measure an intensity of the electromagnetic energy entering the probe to generate intensity signals. The sensor is disposed outside of the hub volume and is communicatively coupled to a processor, such as with a cable. The processor determines an apparent temperature based on the intensity signals.

In another embodiment, a method of controlling processing temperatures is provided and includes aligning a substrate support in a first direction relative to a probe and a pedestal hub of a processing chamber. The back surface of the substrate support includes a set of contact terminals that are coupled on a set of contact pins disposed on the pedestal hub. The substrate support is removably coupled to the pedestal hub using the contact pins and terminals. The method includes positioning a substrate on a support surface of the substrate support and receiving electromagnetic energy emitted from a back surface of the substrate support with a collimator. The collimator is disposed in at least a portion of the hub volume of the pedestal hub. The electromagnetic energy is transmitted from the collimator to a sensor. The sensor generates intensity signals for the electromagnetic energy and determines an apparent temperature of the substrate from the intensity signals.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of apparatus and systems for measuring and controlling the temperature of one or more substrates disposed in a process chamber are disclosed herein. Particularly, substrate processing platforms/apparatus that use multiple chambers for processing a substrate, such as, for example, PVD processes including multiple deposition process sequences, degas processes, etc. Electrostatic chucks (ESC) are used as substrate supports to develop an electrostatic force that holds substrates in-place in various processing areas and are often temperature monitored to order to ensure adequate, controlled and uniform heat transfer to the substrate. The non-contact temperature monitoring system described herein is relatively inexpensive, has a relatively small footprint, improved temperature measurement repeatability across wide temperature ranges and has increased energy efficiency (e.g., reduced thermal loss) when compared to conventional monitoring tools.

Figure 1:
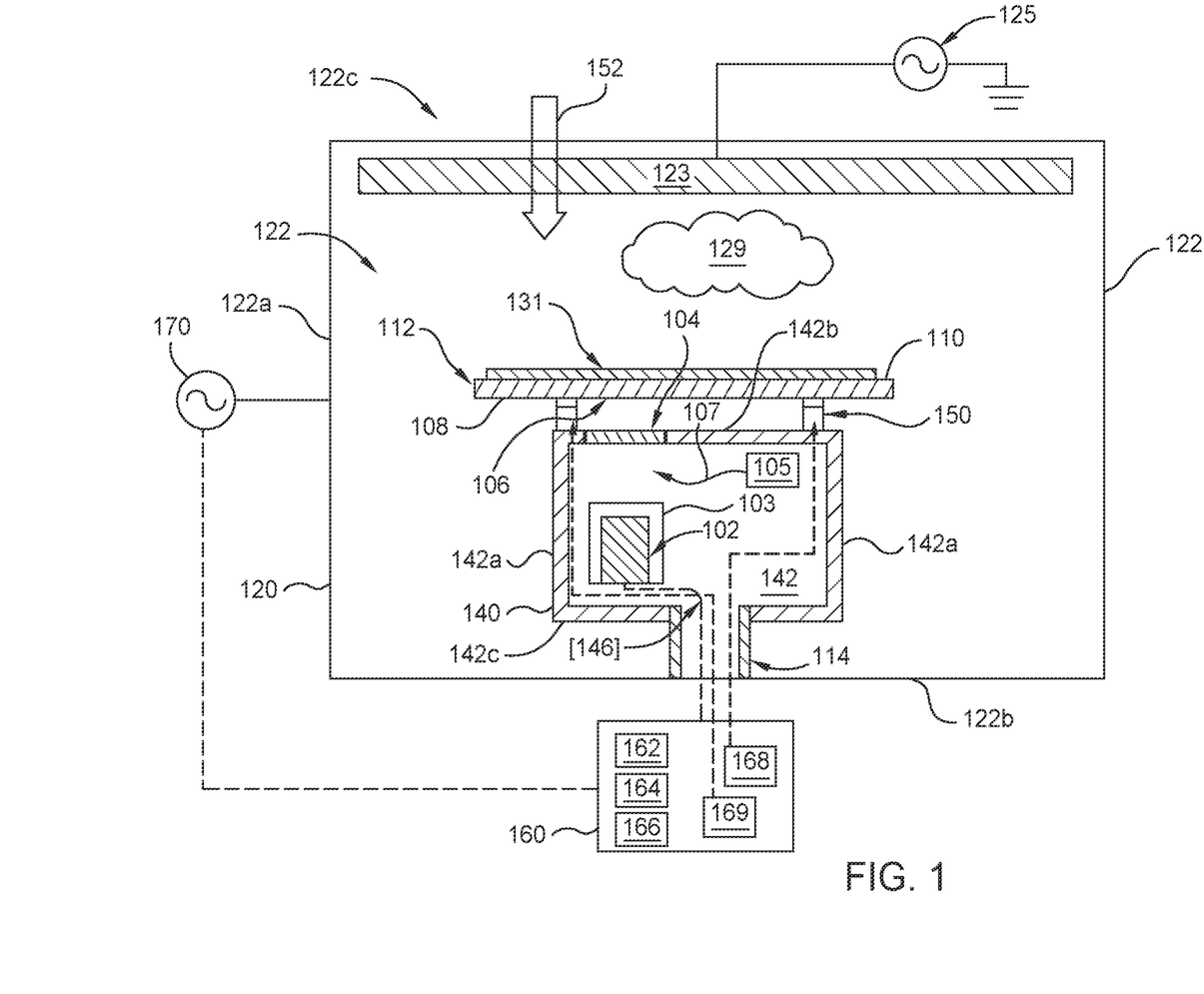
FIG. 1 is a schematic view of a processing chamber including an example temperature measuring assembly, in accordance with at least some embodiments of the present disclosure.

FIG. 1 is a schematic view of a processing chamber 120 including an example temperature measuring assembly, in accordance with at least some embodiments of the present disclosure. The processing chamber 120 includes a processing volume 122 defined by the sidewalls 122a, a bottom portion 122b, and a top portion 122c of the processing chamber 120. In some configurations, as illustrated in FIG. 1, the top portion 122c can include a target 123 and power supply 125 coupled to the sputter target 123. Examples of suitable processing chambers that can be used with one or more aspects of the disclosure provided herein will include physical vapor deposition (PVD) processing chambers (FIG. 1), chemical vapor deposition (CVD) processing chambers, etching chambers, cool down chambers, annealing chambers and atomic layer deposition (ALD) processing chambers. A substrate support 112 and a pedestal hub 140 are disposed in the processing volume 122 of the processing chamber 120. The substrate support 112 is detachable from the pedestal hub 140 using contact pin assembly 150. In operation, the processing volume 122 operates at temperatures of about 25° C. to about 650° C., such as about 25° C. to about 500° C. (e.g., PVD process), or about 100° C. to about 650° C. (e.g., CVD process), such as about 100° C. to about 500° C. (e.g., annealing process), or about 300° C. to about 550° C. In some embodiments, which can be combined with other embodiments disclosed herein, the processing volume 122 includes reduced pressures of about 1 mTorr to about 350 Torr, such as about 1 mTorr to about 200 mTorr (e.g., PVD process), such as about $10^{-8}$ Torr to about $10^{-3}$ Torr, such as about $10^{-7}$ Torr to about $10^{-3}$ Torr (e.g., annealing process), or about 10 Torr to about 350 Torr (e.g., CVD process). The pedestal hub 140 includes a pedestal hub volume 142 defined by side walls 142a, the top surface 142b, and a bottom surface 142c of the pedestal hub 140. In operation, the pedestal hub volume 142 is fluidly isolated from the processing volume 122, and thus includes gas pressures greater than the pressures of the processing volume 122. In particular, the pedestal hub volume 142 includes atmospheric or near atmospheric pressures, such as about 700 Torr to about 800 Torr, such as about 740 Torr to about 780 Torr, such as about 750 Torr to about 770 Torr, such as 760 Torr.

Figure 2A:
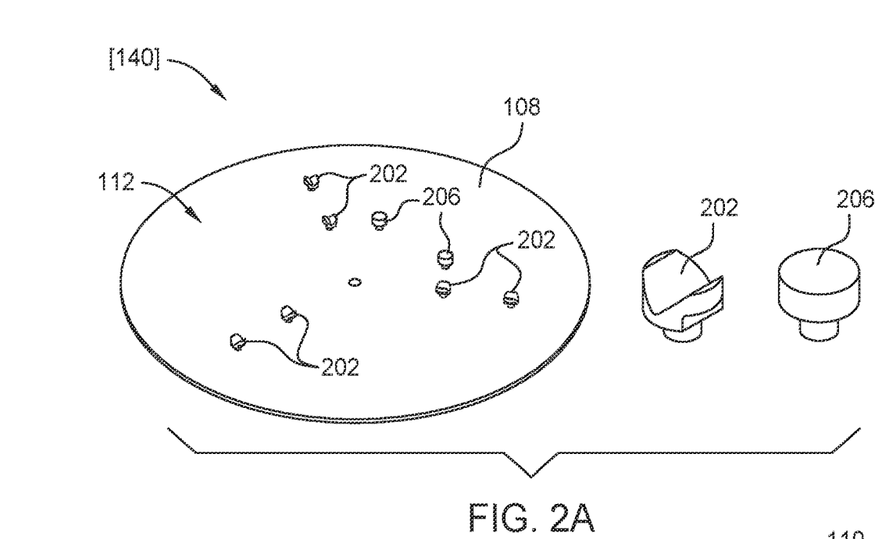
FIG. 2A is a perspective view of a transferable substrate support, in accordance with at least some embodiments of the present disclosure.

FIG. 2A illustrates a perspective view of the substrate support 112 according to one or more embodiments. The substrate support 112 is a transferable substrate support 112 and includes one or more first separable contact terminals 202 and one or more second separable contact terminals 206 disposed on a back surface 108 of the transferable substrate support 112. Each of the one or more first separable contact terminals 202 and each of the one or more second separable contact terminals 206 includes a detachable connection region and an electrical connection region. The electrical connection region is coupled to an electrical element disposed within the transferable substrate support 112. The electrical connection region is operable at high currents, for example up to 30 A, and at high voltages, for example up to 1500 VDC.

In one embodiment, which can be combined with other embodiments disclosed herein, one or more of the one or more first separable contact terminals 202 are concave. In one embodiment, which can be combined with other embodiments disclosed herein, one or more of the one or more first separable contact terminals 202 include a flat surface disposed parallel to the support surface 110 of the transferable substrate support 112. In one embodiment, which can be combined with other embodiments disclosed herein, one or more of the second separable contact terminals 206 include a flat surface disposed parallel to the support surface 110 of the transferable substrate support 112. The one or more first separable contact terminals 202 and the one or more second separable contact terminals 206 are fabricated from molybdenum, tungsten, or a combination thereof in order to reduce total constriction resistance.

Figure 2B:
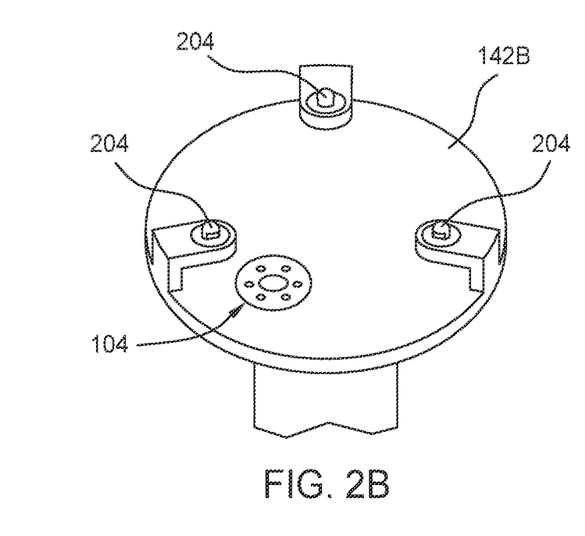
FIG. 2B illustrates a perspective view of a pedestal hub with contact pins, in accordance with some embodiments of the present disclosure.

FIG. 2B illustrates a perspective view of a pedestal hub 140 according to one or more embodiments. A top surface 142B of the pedestal hub 140 includes one or more viewports 104. The pedestal hub 140 includes one or more pins 204 disposed thereon. Each pin of the one or more pins 204 is spaced away from the top surface 142B of the pedestal hub and is configured to detachably connect and disconnect with a corresponding terminal of the one or more first separable contact terminals 202 or the one or more second separable contact terminals 206.

The one or more pins 204 may be fabricated from any suitable material, for example molybdenum, tungsten, or a combination thereof in order to reduce total constriction resistance. In one or more embodiments, the one or more pins 204 and the one or more first separable contact terminals 202 are different materials. For example, in one embodiment, the one or more first separable contact terminals 202 are fabricated from tungsten, and the one or more pins 204 are fabricated from molybdenum. In one or more embodiments, the one or more pins 204 and the one or more first separable contact terminals 202 are fabricated from the same material.

The connection between the one or more pins and the one or more terminals allow the transferable substrate support 112 to self-align with the pedestal hub 140. The detachable connection region of each of the one or more first separable contact terminals 202 and second separable contact terminals 206 is configured to detachably connect and disconnect with a corresponding pin of the one or more pins 204 by repositioning the supporting pedestal hub 140 relative to the transferable substrate support 112 in a first direction.

Figure 2C:
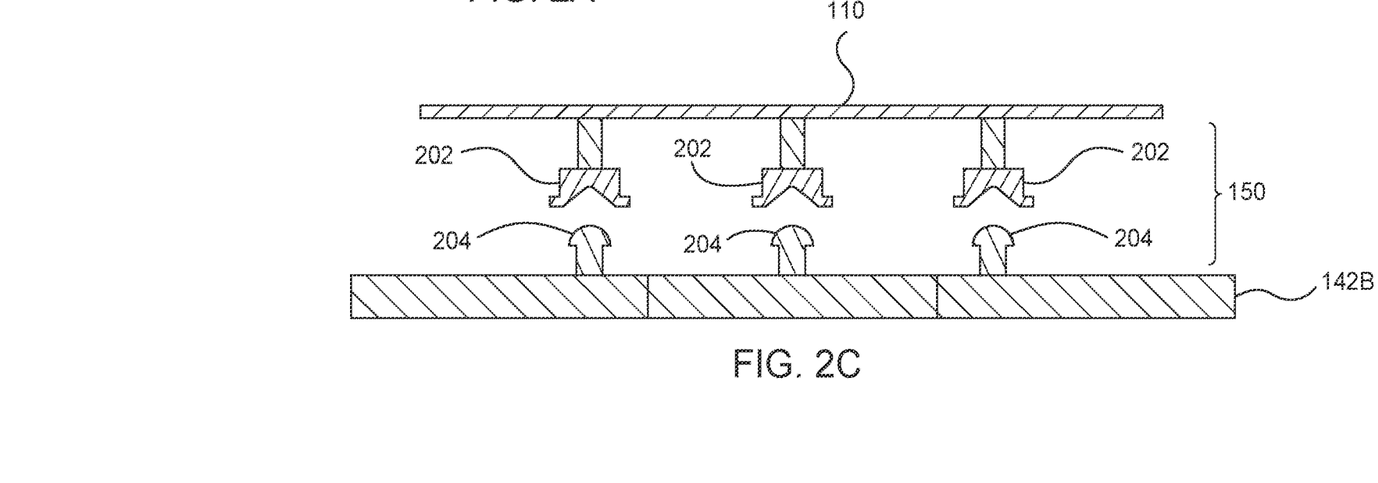
FIG. 2C is a side view of the alignment of contact pins of an example transferable substrate, in accordance with at least some embodiments of the present disclosure.

FIG. 2C illustrates a side view of the contact assembly 150 including the alignment of the one or more pins 204 with the one or more first separable contact terminals 202. As described above, the detachable connection region of each of the one or more first separable contact terminals 202 and second separable contact terminals 206 disposed on the transferable substrate support 112 is configured to detachably connect and disconnect with a corresponding pin of the one or more pins 204 disposed on the pedestal hub 140.

Figure 3:
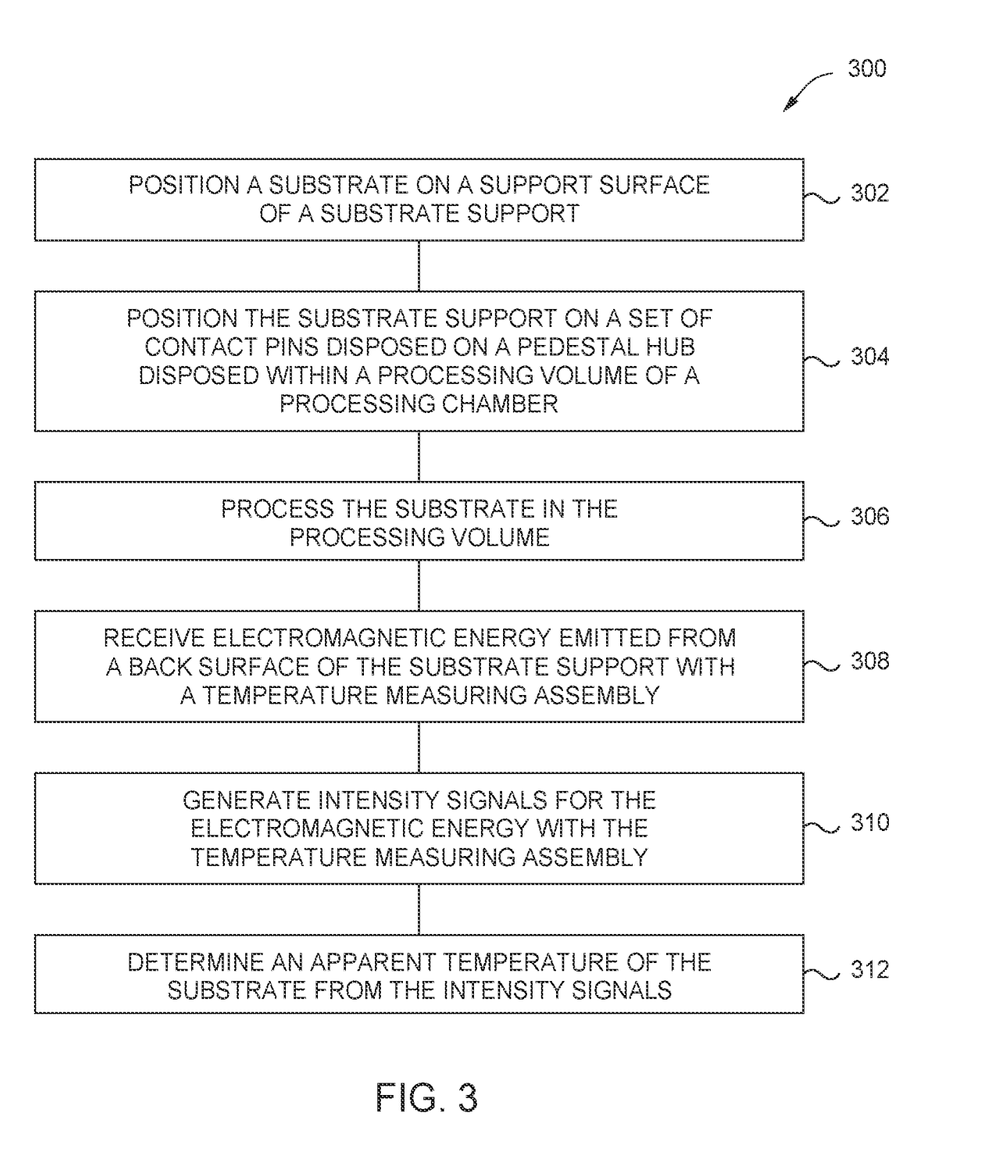
FIG. 3 is a block diagram of an example system for monitoring the temperature of a substrate support, in accordance with at least some embodiments of the present disclosure.

FIG. 3 is a block diagram 300 of an example method for monitoring the temperature of a substrate support 112, in accordance with at least some embodiments of the present disclosure. The operations of FIG. 3 is described herein with reference to FIGS. 1, 2A, 2B, 2C, 4A, 4B, and 4C. The method for monitoring the temperature of a substrate support 112 generally includes the following operations, as will be discussed further below. In operation 302, a substrate 131 is positioned on the support surface 110 of the substrate support 112. In operation 304, the substrate support 112 together with the substrate 131 is positioned on the pedestal hub 140 disposed within a processing volume 122 of a processing chamber 120 and the substrate support is removably coupled to the pedestal hub 140. In some embodiments, the substrate support 112 along with the substrate 131 can be positioned in a first direction relative to a sensor 102 and a pedestal hub 140 of a processing chamber 120. The substrate support 112 is positioned to align a target surface 106 of the back surface 108 of the substrate support 112 over a sensor 102 or a probe 430 (as shown in FIG. 4C). The target surface 106 of the back surface 108 of the substrate support 112 is the surface to be used for a temperature reading.

In operation 306, the substrate 131 is processed in the processing volume 122, wherein the process of processing the substrate is configured to deliver energy to or remove energy from the substrate positioned on the substrate support. In operation 308, electromagnetic energy emitted from a back surface of the substrate support is received by a temperature measuring assembly. In operation 310, intensity signals of the electromagnetic energy is received by the temperature measuring assembly, and in operation 312, an apparent temperature of the substrate is determined from the intensity signals.

In some embodiments, the substrate support 112 is detachable from the pedestal hub 140 by use of the contact pin assembly 150 (e.g., contact terminal 202, 206, contact pin 204), which allows the electrical power and/or fluids to be provided to portions of the substrate support 112 when it is positioned on pedestal hub 140. The detachable configuration of the substrate support 112 is useful to allow a substrate 131 to be continually supported by the substrate support 112 and to limit variations in temperature to be reduced in configurations where the substrate 131 and substrate support 112 are transferred together as one unit between and through other processing chambers (not shown) and/or a cluster tool mainframe (not shown) that is coupled to the processing chamber 120 and other processing chambers. The contact pin assembly 150 includes contact terminals 202, 206 on the back surface 108 of the substrate support 112 which are detachable from contact pins 204 disposed on a top surface 142b of the pedestal hub 140. In some embodiments, which can be combined with other embodiments disclosed herein, the substrate support 112 is aligned such that a target surface 106 of the back surface 108 of the substrate support 112 is disposed over a sensor 102 or a probe 430 (as shown in FIG. 4C). Once aligned, a set of contact terminals 202, 206 of the substrate support 112 is removably coupled to a set of contact pins 204 disposed on a surface of the pedestal hub 140 (e.g., operation 204).

In some embodiments which can be combined with other embodiments described herein, the substrate is positioned on the support surface of the substrate support disposed on a rotating carousel. The substrate support together with the substrate is disposed on a set of contact terminals disposed on the rotating carousel. The rotating carousel rotates the substrate support together with the substrate to the process chamber and transfers the substrate support together with the substrate into the processing volume. The set of contact pins of the substrate support is aligned and placed over a set of contact terminals of the pedestal hub 140 such that the sensor 102 is aligned with the target surface 106.

In some embodiments, as shown in FIG. 1, a controller 160 is adapted to control the delivery of a chucking voltage to a chucking electrode (not shown) disposed within the substrate support 112 by use of a chucking power supply 168 and the one or more pairs of the contact terminals 202, 206 and contact pins 204. Additionally, the controller 160 is also adapted to control the delivery of power to one or more heating elements (not shown) disposed within the substrate support 112 by use of a heater power supply 169 and the one or more pairs of the contact terminals 202, 206 and contact pins 204. Thus, the contact terminals and pins are electrical contacts rated for alternating current (AC) and direct current (DC).

During processing of the substrate 131, a power source 152 provides energy into the processing volume 122 to cause a desired process to be performed on the substrate 131. In some configurations, as shown in FIG. 1, energy provided from the power source 152 is created by a plasma 129 that is formed in the process chamber 120 by the delivery of DC or RF power from the power supply 125. In this case, the formed plasma 129 provides additional heat to the substrate and substrate support 112. The back surface 108 of the substrate support 112 emits electromagnetic energy, such as infrared energy and is received by the temperature measurement assembly (e.g., operation 208). In particular, the electromagnetic energy is emitted from a target surface 106 into at least a portion of the pedestal hub volume 142 through a viewport 104. The viewport 104 is sized to enable the input end, or head of the sensor to receive electromagnetic energy. The some embodiments, which can be combined with other embodiments described herein, the viewport 104 window comprises a diameter of about 15 mm to about 45 mm. A first transferable substrate support 112 together with a first substrate 131 is aligned over the input end of the sensor 102 to enable the sensor 102 to receive electromagnetic energy from the first target surface 106 of the first transferable substrate support 112 together with the first substrate 131. The first transferable substrate together with the first substrate is removed from pedestal hub and a second transferable substrate together with a second substrate is aligned and positioned over the sensor to enable the sensor 102 to receive electromagnetic energy from the second target surface 106 of the second transferable substrate support 112 together with the second substrate 131. After the sensor receives electromagnetic energy from the second target surface 106, the second support is removed from the pedestal hub. In some embodiments, which can be combined with other embodiments disclosed herein, the first transferable substrate is positioned over another sensor, or over the same sensor for further processing and temperature monitoring. Moving the substrate support 112 along with the substrate 131 having self-aligning contact pin assemblies 150, provides repeatable alignment of target surfaces 106 over the sensor 102 and enables efficient temperature assessments of several different substrates that are sequentially processed. Moreover, because the substrate 131 remains on the substrate support 112, movement and shifting of the substrate 131 on the substrate support 112 is greatly minimized during movement from one processing chamber to another. Minimizing movement and shifting of the substrate 131 position relative to the substrate support 112 provides temperature uniformity of the substrate 131. In contrast to the processes described herein, some processes include a substrate support that is typically first coupled to a pedestal hub and a substrate is positioned onto the substrate support within a chamber volume for processing. In this configuration, a sensor disposed below the substrate support measures electromagnetic energy from the same target surface of the substrate support irrespective of the interchange of substrates positioned on the substrate support. In some embodiments, which can be combined with other embodiments described herein, the temperature measurement assembly disclosed herein is used for processes in which the substrate 131 is positioned onto the substrate support 112 that is used within the processing chamber. In such implementations, factors such as temperature uniformity of the substrate 131, temperature of the substrate support 112, position of the substrate 131 relative to the substrate support 112, and/or combinations thereof are considered during calibration, measurement, and calculation of the apparent temperature of the substrate 131.

The viewport 104 can be made from a standard glass material, quartz, germanium, sapphire, kodial, borosilicate, or other suitable materials. However, the viewport material is selected based on a desired percentage of optical transmissivity allowed by the viewport and is coated or is uncoated to adjust the optical transmissivity and/or avoid unwanted reflections. As used herein, the term "optical transmissivity" refers to the percentage of total radiation emitted that is transmitted through the viewport. A suitable viewport includes transmissivity percentages of about 80% or greater, such as about 80% to about 94%, or about 80% to about 90%, at a predetermined spectral range. The predetermined spectral range is determined based on a type of sensor 102 that is selected for the temperature measurement system and the temperature range that the substrate will be processed at during normal processing. In particular, a sensor 102 operating at a spectral range of from about 8 microns to about 14 microns and capable of measuring a temperature range of about −50° C. to about 975° C., is used to measure infrared energy transmitted through a germanium viewport with anti-reflection coating. In some embodiments, which can be combined with other embodiments disclosed herein, the coating is a diamond like carbon (DLC) coating. Alternatively, a sensor 102 operating at a spectral range of from about 2 microns to about 3 microns and capable of measuring a temperature range of about 50° C. to about 400° C. is used with a standard glass viewport. In some embodiments, which can be combined with other embodiments described herein, the standard glass viewport is composed of borosilicate, polycarbonate, quartz, or combinations thereof. Pyrometers are used with standard glass, however, pyrometers are capable of measuring temperatures above 200° C. and are therefore not useful for processes operating at lower temperatures below 200° C. The wavelength emission relationship with temperature is governed by Wien's displacement law. In particular, the spectral radiance of the blackbody radiation per unit wavelength, peaks at a wavelength that is proportional to the absolute temperature. Thus, an IR sensor that is rated for the peak wavelength or spectral range is selected.

Figure 4A:
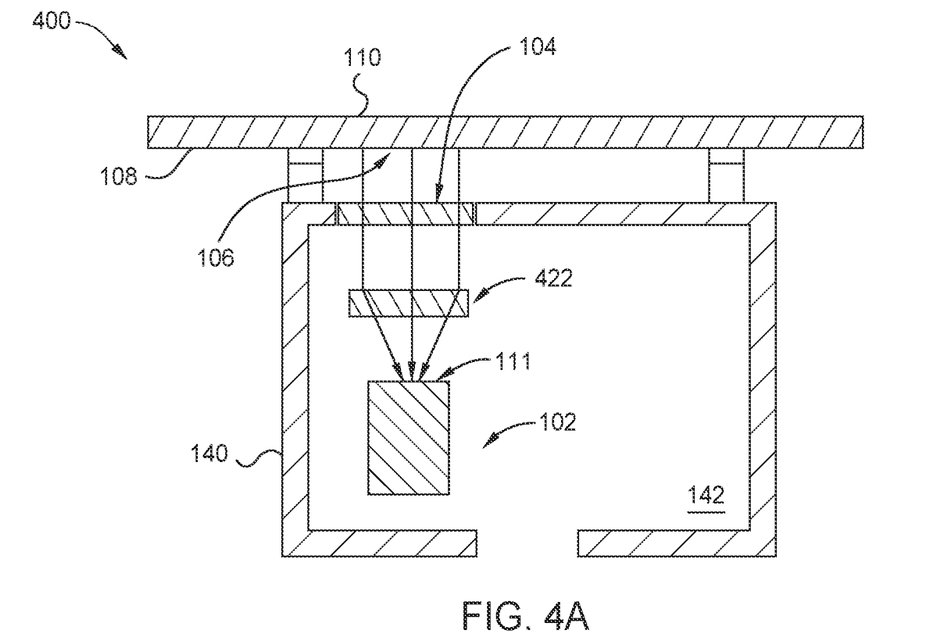
FIG. 4A is a cross-sectional schematic view of temperature measuring assembly including a substrate support and pedestal hub and an temperature sensor with a collector lens in accordance with at least some embodiments of the present disclosure.
Figure 4B:
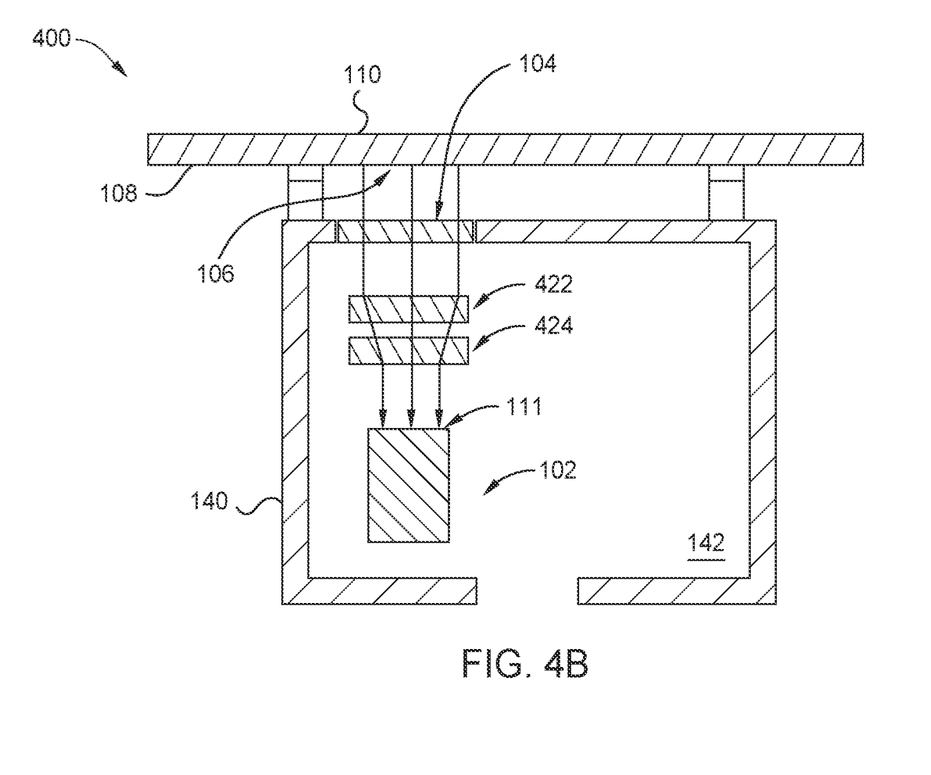
FIG. 4B is a cross-sectional schematic view of temperature measuring assembly including a substrate support and pedestal hub and an temperature sensor with a collector lens and confocal lens in accordance with at least some embodiments of the present disclosure.
Figure 4C:
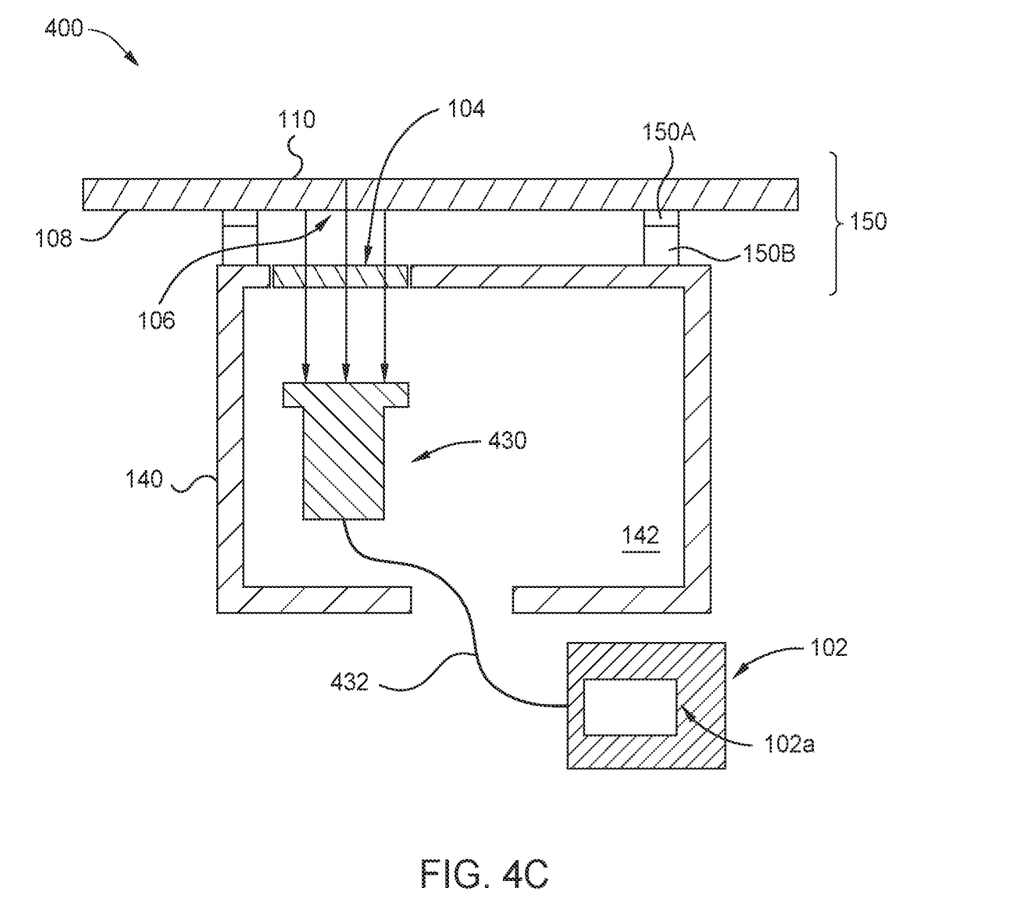
FIG. 4C is a cross-sectional schematic view of temperature sensor assembly including a substrate support and pedestal hub and an temperature sensor with collimator in accordance with at least some embodiments of the present disclosure.

The temperature measurement assembly 400 includes a number of different configurations which are depicted in FIGS. 4A, 4B, and 4C. In some embodiments, which can be combined with other embodiments disclosed herein, the sensor 102 is disposed inside of the pedestal hub volume 142, as shown in FIGS. 4A and 4B. Additionally, the viewport is disposed between an input end 111 of the sensor 102 and the target surface 106. In some embodiments, which can be combined with other embodiments disclosed herein, one or more additional lenses are disposed between the input end 111 of the sensor 102, such as collector lens 422 as shown in FIG. 4A, or collector lens 422 with an additional confocal lens 424 as shown in FIG. 4B. The temperature measurement assembly depicted in FIG. 4A, with a single collector lens 422, provides adequate sensitivity at low temperatures of the substrate and is suitable for temperature measurements for some purposes and/or processes, such as high temperature processes.

Alternatively, additional lenses are used, such as the confocal lens 424 as depicted in FIG. 4B. The additional lens increases the amount of photon received by the sensor and further enhances sensitivity at lower temperatures which is suitable for temperature measurements for some purposes and/or processes, such as low temperature processes. Thus, a trade-off is observed between the use of additional lenses and enhanced sensitivity. In particular, additional lenses increases hardware complexity and cost, but provides enhanced accuracy of temperature measurements at low processing chamber temperatures. One or more of the lenses are coated and/or one or more of the lenses are uncoated. The lenses are curved and configured to concentrate infrared radiation to the sensing elements within the sensor 102. In particular, the one or more lenses extend measurement length between the sensor and the target surface.

Alternatively, the sensor 102 is disposed outside of the pedestal hub volume 142, as shown in FIG. 4C. A probe 430 is disposed in the pedestal hub volume 142 and is coupled to the sensor 102 by an optical fiber 432, as shown in FIG. 4C. In some embodiments, which can be combined with other embodiments described herein, the sensor 102 has a design temperature of about 50° C. to about 100° C., such as about 60° C. to about 70° C. For high temperature processes, such as processes exceeding 500° C., or exceeding 600° C., the sensor 102 is moved away from hot zone to prevent the sensor 102 from overheating, signal-to-noise ratio related signal detection concerns and/or reduced sensor lifetime. The sensor 102 is moved outside of the pedestal hub volume 142 and coupled with an optical fiber 432 to the probe 430 disposed in the pedestal hub volume 142.

In particular, the probe 430 is a collimator. A collimator (e.g., collector) collects electromagnetic energy and directs the energy to a specific and/or a more aligned and/or a more narrow direction relative to the sensor. Using a collimator disposed inside of the pedestal hub 140 enables the detector 102a portion of the sensor 102 to be moved outside of the heated zone. The collimator is coupled to the detector 102a using the optical fiber 432. The fiber optics and coupler induce efficiency loss which is a consideration during initial set up, calibration, and operation of the temperature sensor assembly. Additionally, the viewport is disposed between an input end of the probe 430 and the target surface 106. In each example depicted in the figures, the sensor 102 is coupled to a controller 160 (as shown in FIG. 1).

In some embodiments, which can be combined with other embodiments of the present disclosure, the sensor is useful to detect temperatures at about −50° C. to about 975° C., such as about 25° C. to about 600° C., such as 50° C. to about 400° C. and to detect electromagnetic energy wavelengths at about 1 microns to about 14 microns, such as about 2 microns to about 3 microns, or about 8 microns to about 14 microns. The distance from the input end of the sensor to the target surface 106 of the substrate support 112 is from about 20 mm to about 150 mm, such as about 40 mm to 100 mm, such as from about 50 mm to about 80 mm. In some embodiments, which can be combined with other embodiments disclosed herein, the sensor is a small IR sensor that is disposed in the pedestal hub. The sensor is about 20 mm to about 30 mm long, such as about 25 mm to about 32 mm, such as about 28 mm. The sensor is about 10 mm to about 20 mm wide, such as about 12 mm to about 16 mm wide. The sensor has an optical resolution of about 20:1 to about 24:1, such as about 22:1. As used herein, the term "optical resolution" refers to a ratio of a distance between a sensor and target surface to a diameter of the target surface being measured. A sensor with high optical resolution (e.g., large ratio) is able to measure a small target surface at a large distance more accurately with limited background interference. A narrow beam path, which is characteristic of a high optical resolution sensor, enables reduction of noise from the surrounding environment. The control of the surface finish of the small, temperature measurement target spot provides a reduction in measurement noise which enables better temperature measurement accuracy and/or repeatability due to the impact that the well controlled surface finish has on the emissivity of the surface.

Selection of a sensor for embodiments disclosed herein provides an adequate optical resolution for reliable temperature measurements taking into consideration limitations such as the viewport size, distance between the sensor and the target surface, space allowance within hub volume for sensor, cost and combinations thereof.

The sensor is rated to operate in temperatures below 180° C., such as below 120° C., such as below 100° C., such as below 80° C. In some embodiments, which can be combined with other embodiments, the sensor 102 is disposed at a distance away from the viewport inside of the hub volume 142 to be kept within design temperatures. The temperature of the hub is managed using cooling channels that receive a cooling fluid (e.g., water) from a source (not shown). The cooling channels and source are typically able to maintain the hub at a temperature of less than 100° C., such as about 50° C. to 100° C. Alternatively, the temperature of the sensor 102 is managed using a cooled housing 103 to improve the signal-to-noise ratio of the signal received from the target surface 106 of the substrate support 112. The temperature of the viewport 104 is managed using pressurized air 107 from a gas source 105. Alternatively, the temperature of the sensor is managed by purging the hub volume with clean dry air. In some embodiments which can be combined with other embodiments described herein, the hub volume is purged with clean dry air when the temperature of the viewport 104 is above 90° C., such as above 100° C. A viewport 104 with high transmissivity such as greater than 80%, or about 85%, or greater than 85%, absorbs less IR waves and less heat relative to viewports 104 with transmissivity less than 80%.

The back surface 108 of the substrate support 112 is composed of a metal, a metal nitride, a metal oxide, or mixtures thereof. The substrate support 112 is composed of aluminum nitride, aluminum oxide, boron carbide, silicon carbide, stainless steel, or mixtures thereof. The sensor is disposed in an ambient pressure environment and measures a temperature of the substrate support 112 disposed within a reduced pressure environment by use of the viewport 104. In an initial setup phase, the sensor 102 can be calibrated using a thermocouple to account for emissivity of the target surface, transmissivity through the glass, noise from adjacent heated surfaces and other thermal radiation factors at one or more points throughout the temperature measurement range. The temperature measuring assembly is configured to receive electromagnetic energy and generate intensity signals from the received electromagnetic energy (e.g., operation 210).

The sensor 102 is communicatively coupled to a temperature controller 160 that controls the power source 152 (e.g., sputter power supply 125) and the heater power supply 169 used to control the temperature of the substrate 131. The controller 160 monitors intensity signals from the sensor 102, calculates the temperature of the target surface 106 based on the intensity signals of the sensor readings, and manipulate the heater power supply 169 (e.g., activate a heater power feed 170 to the processing volume) to manage the temperature of the substrate 131 relative to a predetermined processing temperature. The temperature controller 160 includes a proportional integral derivative (PID) closed loop controller which monitors intensity signals from the sensor 102. In some embodiments, which can be combined with other embodiments described herein, the predetermined processing temperature while processing the substrate is about 25° C. to about 650° C., such as about 25° C. to about 500° C., or about 100° C. to about 650° C., such as about 100° C. to about 500° C., or about 300° C. to about 550° C. In some embodiments, which can be combined with other embodiments disclosed herein, the processing volume 122 includes reduced pressures of about 1 mTorr to about 350 Torr, such as about 1 mTorr to about 200 mTorr, such as about $10^{-8}$ Torr to about $10^{-3}$ Torr, such as about $10^{-7}$ Torr to about $10^{-3}$ Torr, or about 10 Torr to about 350 Torr. The controller 160 includes a processor 162. In some embodiments, which can be combined with other embodiments described herein, the controller includes a memory 164 and a support circuit 166 used to control a power intensity from the power source.

Alternatively, the controller 160 is communicatively coupled to a control module for the processing apparatus and the control module includes a memory 164 and a support circuit 166 used to control a power intensity from the power source. The control module includes a central processing unit (CPU). The CPU takes the form of a general purpose computer processor, such as those used in an industrial setting. Software routines are stored in the memory, such as remote storage systems, random access memory, read only memory, floppy, or hard drive disk, or other forms of digital storage. The support circuit is coupled to the processor using any configuration known in the art including cache, clock circuits, input/output systems, power supplies, and the like. Bi-directional communications between the control module and the various components (e.g., controllers, sensors, power sources, and valves) of the processing chamber 120 are handled through numerous signal cables, by wireless signals, or combination (e.g., depicted by dashed lines in FIG. 1).

The processor 162 calculates the apparent temperature of the substrate based on the intensity signals from the output end of the sensor 102. Additionally, the processor 162 calculates the emissivity of the target surface 106 based, in part, on the intensity signals from the output end of the sensor. As used herein, the "emissivity" of an object is a ratio of its emitted spectral intensity to that of a black body at the same temperature. The processor calculates the temperature of the substrate using a relationship between thermal radiation energy and temperature as determined by equation (1):

$$Q = \varepsilon \sigma A T^4 \quad (1)$$

where:
  Q is the thermal radiation energy;
  ε is emissivity;
  σ is the Boltzman Constant;
  A is the target surface area; and
  T is the temperature of the target surface.

The sensor 102 is calibrated at a calibration temperature within a predetermined process temperature range. The sensor 102 is calibrated using a direct temperature measurement at a calibration temperature, such as with a thermocouple that is provided for test and/or calibration purposes. In particular, a contact thermocouple measures the temperature of an object simultaneously with a sensor. Alternatively, the sensor measures the temperature of the same object under the same conditions (e.g., at the calibration temperature) as the thermocouple. The apparent temperature calculated by the processor communicatively coupled to the sensor is adjusted to match the temperature displayed by the thermocouple. The calibration reduces the effect of environmental noise that interferes with sensor detection and measurements. Additionally, the calculated emissivity of an object changes with temperature and produces an emissivity error as the calculated temperature deviates from the calibration temperature for the sensor. The emissivity error is factored into the calculations used to determine the substrate temperature. The emissivity data is generated experimentally for various materials such as for aluminum nitride. In some embodiments, which can be combined with other embodiments described herein, an emissivity library including emissivity for operating parameters such as temperature is stored for various substrate support materials in memory and/or is accessible to the processor. The process of calibrating the sensor 102 may be performed multiple times throughout the life of a substrate support 112 to avoid a drift in the detected temperature due to changes in the target surface emissivity or environmental changes.

Conventional temperature measurements are taken directly through the shaft 114 of a system 100 at the same surface of the substrate support 112 throughout the life of the processing chamber 120. In contrast, as can be seen from FIG. 1, the target surface 106 of the present disclosure is not at the center of the back surface of the substrate support 112 and can be used on many different substrate supports 112 that are moved within the cluster tool. The difference in target surface 106 location and use of different substrate supports 112 at different stages of their lifetime and processing history are all a consideration for temperature control and repeatability concerns.

In some aspects of the present disclosure, a non-transitory computer readable medium having instructions stored thereon that, when executed, causes the example method 200 to be performed. While the foregoing is directed to embodiments of the present disclosure, other and further embodiments of the disclosure may be devised without departing from the basic scope thereof, and the scope thereof is determined by the claims that follow.

The invention claimed is:

1. A substrate processing apparatus, comprising:
  a substrate support removably coupled to a pedestal hub that defines at least a portion of a hub volume within a processing volume of a processing chamber, the substrate support comprising a substrate interfacing surface and a back surface;
  wherein:
    the pedestal hub comprises a set of contact pins disposed on a top surface of the pedestal hub,
    the back surface of the substrate support comprises a set of contact terminals each having a repositioning feature configured to detachably connect and disconnect with a corresponding repositioning feature of each contact pin of the set of contact pins, and
    one or more of the contact terminals and the contact pins comprise a detachable connection region that is configured to align the substrate support to the pedestal hub when the contact terminals of the substrate support are disposed on the contact pins of the pedestal hub.

2. The substrate processing apparatus of claim 1, wherein the contact terminals and the contact pins comprise electrical contacts configured to couple to an electrical element.

3. The substrate processing apparatus of claim 2, wherein the electrical contacts are configured to operate up to 30 amps and up to 1500 VDC.

4. The substrate processing apparatus of claim 1, wherein the hub volume of the pedestal hub is exposed to atmospheric pressure.

5. The substrate processing apparatus of claim 1, the pedestal hub further comprising a viewport with a diameter of about 15 mm to about 40 mm.

6. The substrate processing apparatus of claim 1, wherein the substrate support is comprised of aluminum nitride, aluminum oxide, boron oxide, silicon carbide, stainless steel or any combination thereof.

7. The substrate processing apparatus of claim 1, wherein the back surface of the substrate support is comprised of a metal.

8. The substrate processing apparatus of claim 7, wherein the metal is further comprised of a metal nitride, metal oxide, or any combination thereof.

9. The substrate processing apparatus of claim 1, wherein the contact pins and the contact terminals are made from molybdenum, tungsten, or a combination thereof.

10. The substrate processing apparatus of claim 9, wherein the contact pins and contact terminals are made from different material from each other.

11. The substrate processing apparatus of claim 1, wherein the hub volume is configured to receive a gas to maintain a viewport temperature of above 90 degrees Celsius.

12. The substrate processing apparatus of claim 1, wherein contact pins are spaced away from the top surface of the pedestal hub.

13. The substrate processing apparatus of claim 1, wherein the set of contact terminals comprise a first set of contact terminals and a second set of contact terminals.

14. The substrate processing apparatus of claim 13, wherein the first set of contact terminals has a flat surface disposed parallel to the substrate interfacing surface.

15. The substrate processing apparatus of claim 14, wherein the second set of contact terminals has a flat surface disposed parallel to the substrate interfacing surface.

16. The substrate processing apparatus of claim 13, further comprising the substrate support disposed on the first set of contact terminals or the second set of contact terminals disposed on a rotating carousel.

17. The substrate processing apparatus of claim 1, wherein the repositioning feature of the set of contact terminals has a flat shape.

18. The substrate processing apparatus of claim 1, wherein the repositioning feature of the set of contact terminals has a concave shape.

19. The substrate processing apparatus of claim 1, wherein the repositioning feature of the set of contact terminals has a convex shape.

20. The substrate processing apparatus of claim 1, wherein set of contact terminals comprises three contact terminals that are configured to detachably connect and disconnect with three corresponding contact pins of the set of contact pins.

* * * * *